United States Patent
Daoud et al.

[19]

[11] Patent Number: 5,928,030
[45] Date of Patent: Jul. 27, 1999

[54] BRIDGING CLIP FOR WIRE WRAPPED TERMINALS

[75] Inventors: Bassel Hage Daoud, Parsippany; Christopher M. Helmstetter, Bridgewater, both of N.J.

[73] Assignee: Lucent Technologies Inc., Murray Hill, N.J.

[21] Appl. No.: 09/109,274

[22] Filed: Jun. 30, 1998

[51] Int. Cl.[6] .................................................. H01R 31/08
[52] U.S. Cl. ............................................................ 439/510
[58] Field of Search ..................................... 439/510, 513, 439/266, 512

[56] References Cited

U.S. PATENT DOCUMENTS 2,906,985  9/1959  Gauld ....................................... 439/510
4,553,802  11/1985 Ruehl ....................................... 439/266
4,588,240  5/1986  Ruehl et al. ............................. 439/513

*Primary Examiner*—Gary Paumen
*Assistant Examiner*—Antoine Ngandjui

[57] ABSTRACT

A bridging clip for providing electrical connection between adjacent terminals; in particular, terminals having wire wrap connection wounded on the tail end of the terminals. The bridging clip comprises two integrated and electrically conductive walls, creating a groove therebetween for engaging the wire wrap connection of adjacent terminals. Along each wall is at least one corresponding cut-out, which are indented into the groove for independently engaging the tail ends of adjacent terminals. Multiple electrical contact is achieved by the walls and cut-outs of the bridging clip. The bridging clip is made of a resilient material which provides positive electrical contact and allows repetitive use.

7 Claims, 3 Drawing Sheets

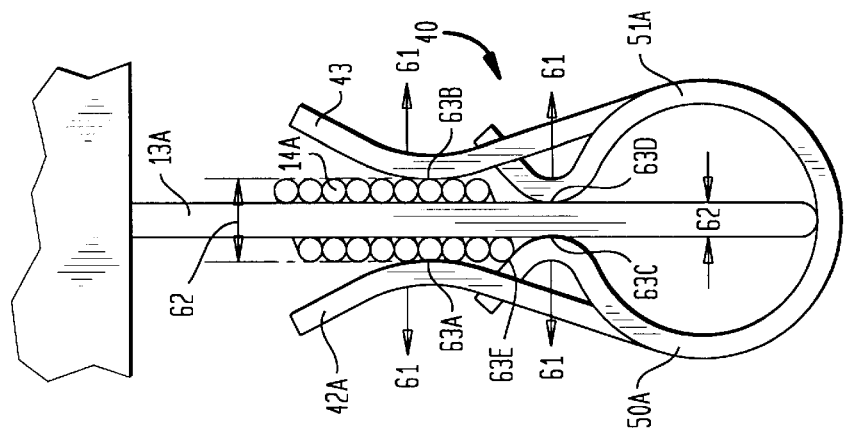
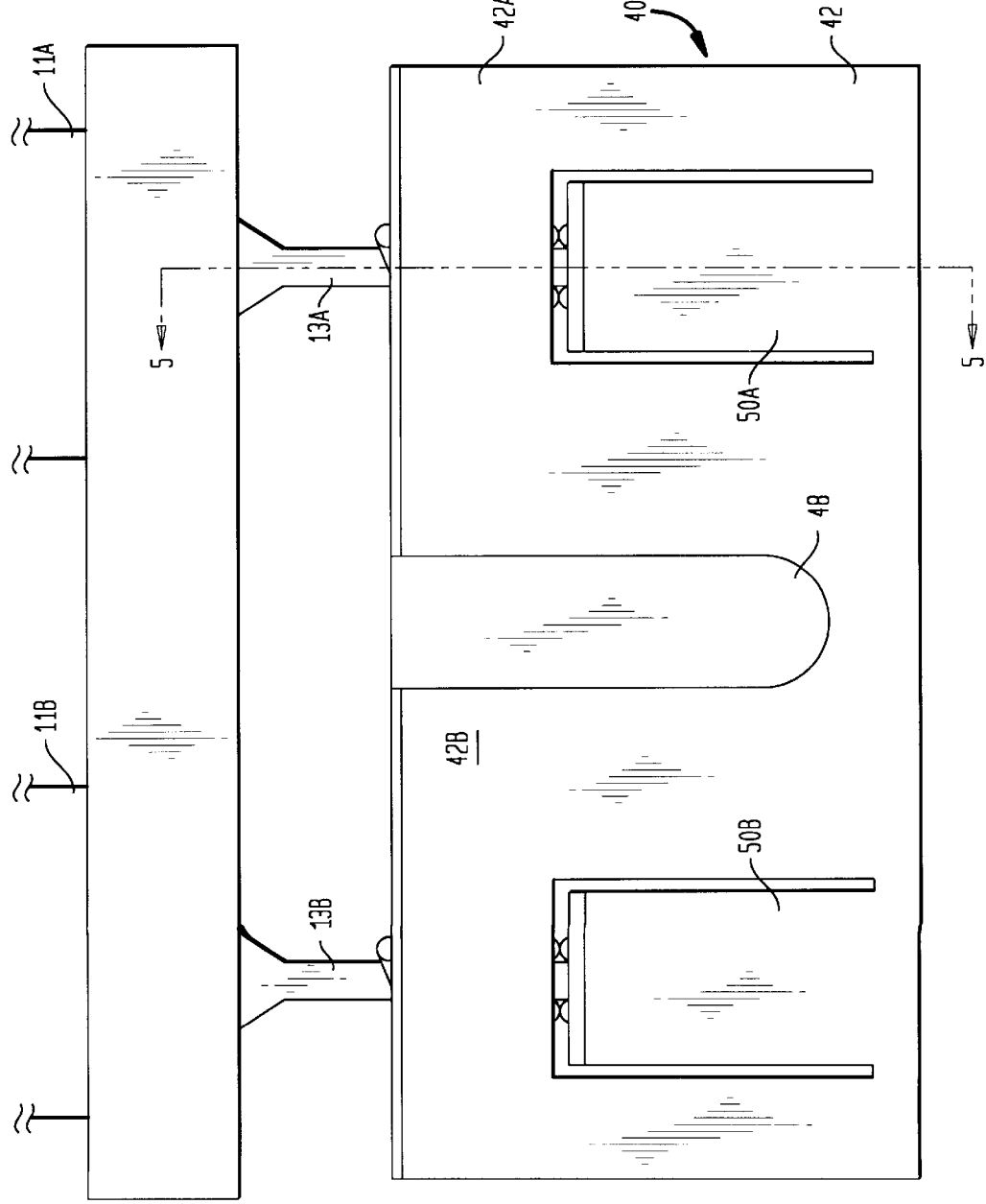

BRIDGING CLIP FOR WIRE WRAPPED TERMINALS

FIELD OF THE INVENTION

The invention relates to a device for making electrical connections between adjacent wire wrapped terminals, which provides reliable and multiple independent contacts of the terminals.

BACKGROUND OF THE INVENTION

In a telephone network, cables containing numerous telephone lines from a telephone service provider's central office enter a building through a junction box or a building entrance protector. Telephone lines, each representing a separate telephone number, are then connected and distributed at the junction box to different locations within the building.

A junction box contains a plurality of terminals, each having a head end and a tail end, with the head ends of the terminals connected to conductors leading to different locations within the building and the tail ends of the terminals connected to conductors from the telephone service provider's central office. Telephone lines from the telephone service provider are typically wire-wrapped to the tail ends of the terminals.

Generally, different locations of a building are provided with different telephone numbers. Hence, the tail end of each terminal is connected to a telephone line representing one telephone number and the head end of each terminal is connected to a specific location. However, there are instances where it is desirable to have the same telephone number appearing at two different locations within the building. In order to achieve this result, the tail ends of the two terminals, which lead to the two different locations, must be connected to each other.

A method of connecting the tail ends of two terminals is to wire-wrap each of two ends of a wire to the respective tail ends of the terminals. One of the disadvantages of this method is the requirement that a special wire wrapping tool be used to produce reliable connections. Another disadvantage is the use of additional wires in a junction box already cluttered with numerous wires. Furthermore, wire wrap connections are time consuming and costly.

A prior art device overcame the disadvantages of the wire-wrapped method mentioned above by utilizing an electrically conductive clip to bridge the connections. The prior art bridging clip is designed to make contact with the tail ends of two adjacent terminals when forced upon the tail ends of the terminals. The prior art clip makes two contact points upon the tail end of each terminal. To ensure contact of the two terminals, the prior art clip contains a notch, which allows independent engagement of the two terminals. One of the disadvantages of the prior art clip is insufficient electrical contacts with the terminals when the tail ends of the terminals are dirty or corroded. Another disadvantage is the inability to maintain good contact when the terminals have wire wrap connection on the tail ends, which prevents full insertion of the clip.

Therefore, there is a need for an invention that provides a bridging clip for connecting the tail ends of adjacent terminals having wire wrap connection to achieve simultaneous and positive contacts between the clip and both the tail ends and the corresponding wire wrap connections of the terminals.

SUMMARY OF THE INVENTION

The invention provides a device for making electrical connection between adjacent terminals, in particular, terminals connecting telephone lines for distribution in a junction box of a telephone network.

The invention provides a bridging clip that facilitates insertion upon wire wrapped tail ends of adjacent terminals. The bridging clip also provides multiple independent contact points to ensure electrical conductivity.

The bridging clip comprises of two integrated longitudinally extending walls opened on one end of the walls, creating a groove therebetween. The two walls are designed to snugly engage the wire wrap connection of the terminal. On the surface of each wall is at least one corresponding cut-out, which are indented into the groove created between the two walls. The corresponding cut-outs are designed to snugly engage the tail end of the terminal. The bridging clip also contains at least one notch on at least one of the wall to allow independent engagement of adjacent terminals.

The bridging clip is made of an electrically conducting material that is resilient. The bridging clip is manually insertable upon the tail ends of adjacent terminals when it is desirable to have the locations served by the terminals to have the same telephone line or number. Electrical contact of adjacent terminals is accomplished at multiple contact points: at both the wire wrap connections and the tail ends of the terminals.

BRIEF DESCRIPTION OF THE DRAWINGS

FIG. 4 is an enlarged view of the tail ends of two terminals shown as box "X" in FIG. 1 connected by the present invention.

FIG. 5 is a cross sectional view of the present invention taken along line 5A–5B in FIG. 4.

DETAILED DESCRIPTION OF THE PREFERRED EMBODIMENTS

Figure 1:
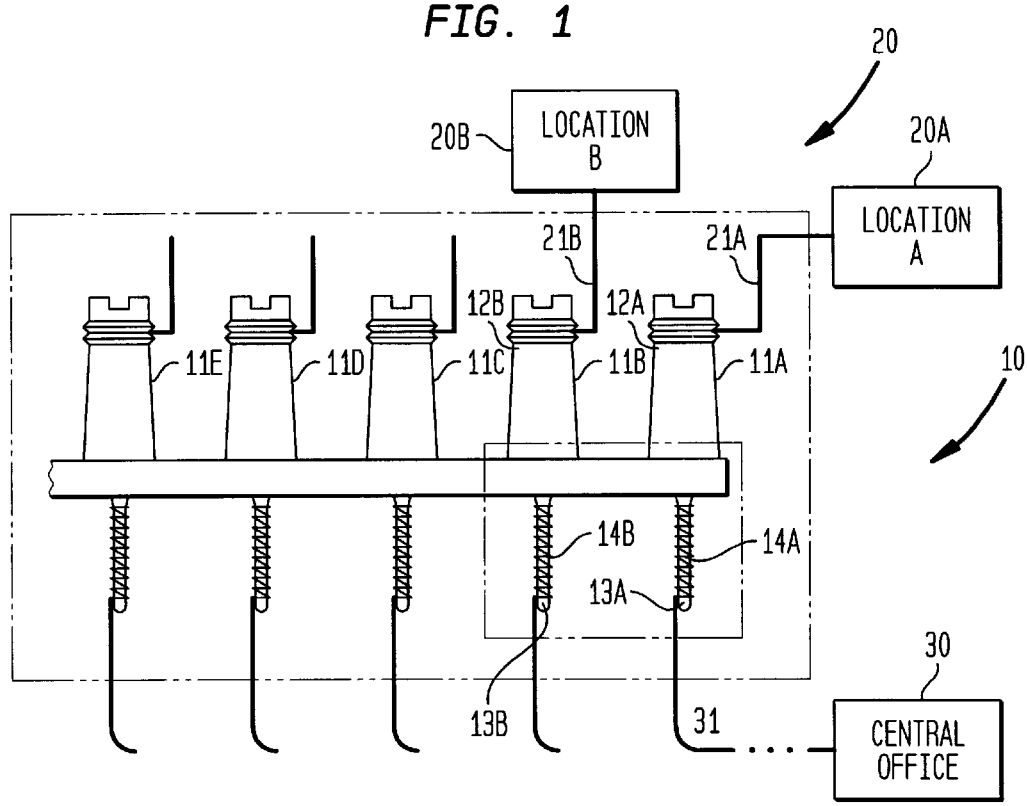
FIG. 1 is a schematic generally illustrating the principles of the present invention.

With reference to the drawings, wherein the same reference number indicates the same element throughout, there is shown in FIG. 1 a schematic generally illustrating how the present invention may be used. FIG. 1 shows a representative telephone system comprising of a junction box or building entrance protector 10 where telephone lines 31 enter from a telephone service provider's central office 30 for distribution to different sites 20 located within a building.

FIG. 1 shows that junction box 10 comprises of a plurality of terminals 11, illustrated as 11A, 11B, 11C, 11D and 11E. Each terminal 11 having a head end 12 and a tail end 13. The tail end 13A of terminal 11A is connected through conductor 31 to central office 30. Conductor 31 represents a telephone line having a distinct telephone number. Connection between conductor 31 and tail end 13A is achieved by a wire wrap connection 14A wounded onto tail end 13A, known in the telephone art. Telephone line 31 is then distributed to a specific location within the building served by junction box 10 via head end 12A of terminal 11A and conductor 21A, which leads to location "A" 20A. Head ends 12 of terminals 11 is shown in FIG. 1 to be a screw-post type, but any other types of head ends 12 known in the telephone art, such as a push cap type, may be substituted.

The present invention, to be described with FIGS. 2, 3, 4 and 5, provides a device for allowing telephone line 31 be simultaneously fed to two adjacent terminals 11A and 11B and hence be distributed to two different locations 20A and 20B, respectively.

Figure 2:
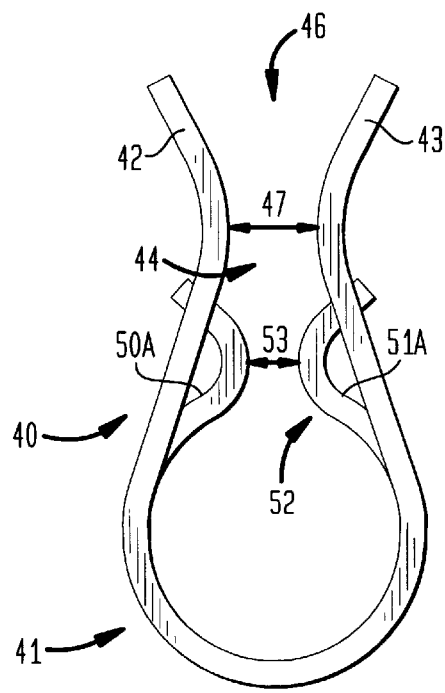
FIG. 2 is a side view of the present invention.

FIG. 2 illustrates the bridging clip 40 of the present invention. The side view of bridging clip 40 illustrates the shape to be essentially an elongated Greek letter omega 41 ("Ω"). Two integrated walls 42 and 43 forming the omega-shape 41 extend longitudinally to create a groove 44 therebetween with an opening 46 on one end. The narrowest distance 47 between walls 42 and 43 is at a predetermined distance slightly less than the diameter of tail end 13 of terminal 11 having wire wrap connection 14.

Figure 3:
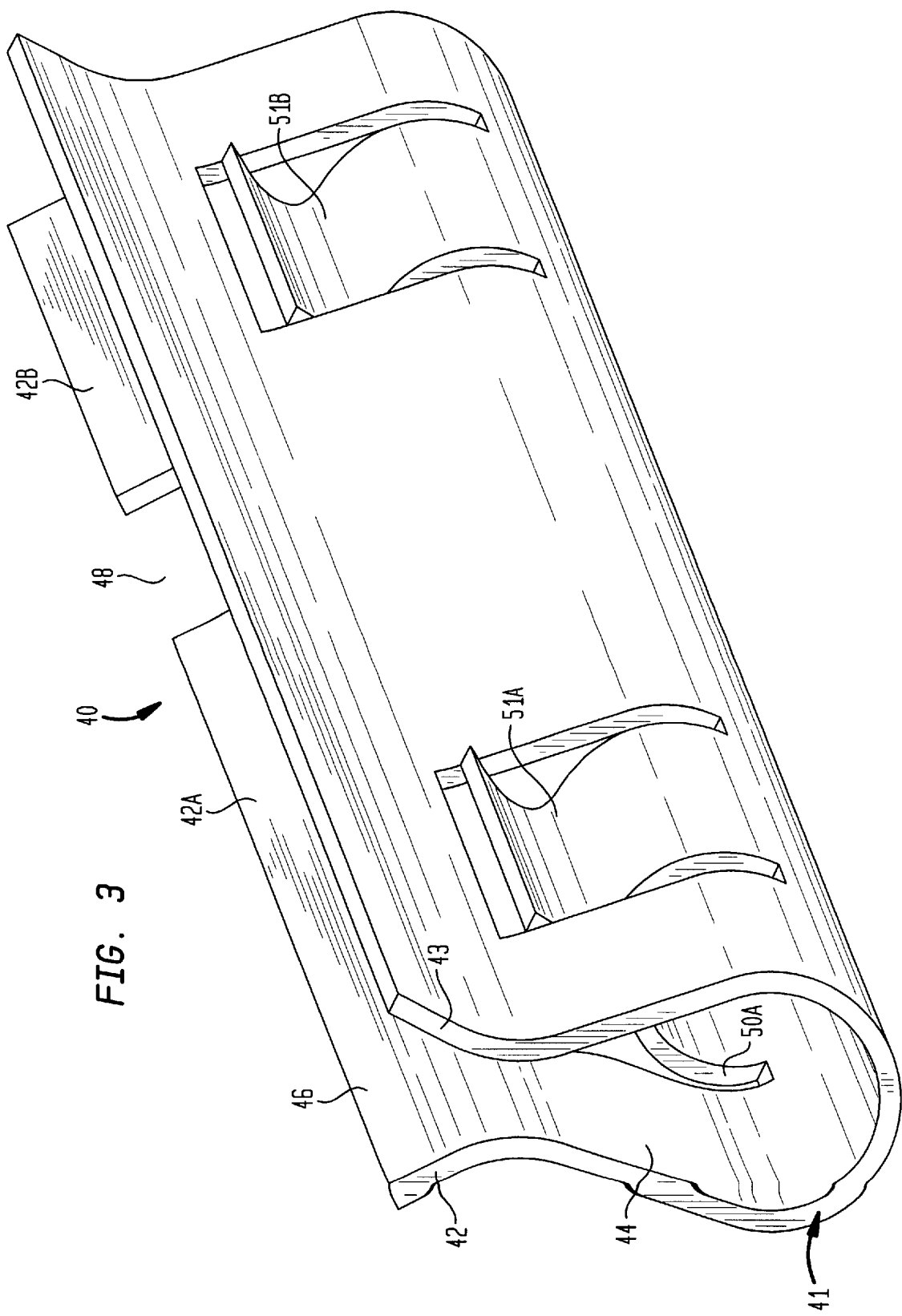
FIG. 3 is a perspective view of the present invention.

Along each wall 42 and 43 is a pair of "U"-shaped cut-outs 50 and 51, respectively, best shown in FIGS. 3 and 4. Each corresponding pair of "U"-shaped cut-outs 50A and 51A form the shape of the Greek letter omega 52 that is non-elongated and overlaps portion of the omega-shape 41 formed by the two walls 42 and 43. The omega-shape 52 of the cut-outs 50A and 51A are indented from the walls 42 and 43 into groove 44. The narrowest distance 53 between cut-outs 50A and 51A is slightly less than the diameter of tail end 13 of terminal 11. The overlapped omega-shape 41 and 52 facilitates the handling of bridging clip 40 while inserting it to and removing it from the terminals. Variation in the cross-sectional shape of the bridging clip 40 may also be used without detracting from the spirit of the invention.

FIG. 3 illustrates the features of bridging clip 40 described above in a perspective view.

Bridging clip 40 is made of an electrically conductive material that is resilient, such as spring steel or brass. However, other conductive and resilient material may be used. Resiliency of the material allows repetitive use of bridging clip 40.

FIG. 4 illustrates the bridging clip 40 connecting tail ends 13A and 13B of terminals 11A and 11B. Each cut-out 50 and 51 along each wall 42 and 43 is spaced-apart at a predetermined distance for engaging tail ends 13A and 13B, respectively.

As shown in FIG. 4, along wall 42 and between the pair of cut-outs 50A and 50B is a notch 48. Notch 48 divides wall 42 into two portions 42A and 42B. Notch 48 allows independent flexing of walls 42A and 42B when engaging terminals 11A and 11B. If wire wrap connection 14A has a larger diameter than wire wrap connection 14B or if there is no wire wrap connection 14B on tail end 14B, wall 42A flexes more without interfering with wall 42B, thereby achieving optimal electrical contact of both terminals 11A and 11B. A similar notch (not shown) may also be provided along wall 43 between the pair of cut-outs 51A and 51B.

FIG. 5 illustrates the cross-sectional view of bridging clip 40 engaging terminal 11A. When bridging clip 40 is pushed against the tail end 13A of terminal 11A for engagement, walls 42A and 43 and cut-outs 50A and 51A flex, independently, axially away from tail end 13A in the direction shown by directional arrows 61. Since bridging clip 40 is made of a resilient material, a counter force shown by directional arrows 62 is exerted by bridging clip 40 against tail end 13A and wire wrap connection 14A, creating a plurality of positive contact points 63A, 63B, 63C, 63D and 63E.

The specification above discussed a bridging clip 40 designed for two adjacent terminals, and a bridging clip 40 capable of interconnecting three or more adjacent terminals is contemplated and corresponds to the description for a two terminal bridging clip 40 and is not separately discussed herein.

Although certain features of the invention have been illustrated and described herein with respect to telephone connections, the invention may be used with other connections as well. Other better modifications and changes will occur to those skilled in the art. It is, therefore, to be understood that the appended claims are intended to cover all such modification and changes that fall within the spirit of the invention.

What I claim is:

1. A bridging clip for making electrical connections between adjacent terminals, each of said terminal having a tail end and a wire wrap connection wounded on said tail end comprising:

(a) an integrated first and second longitudinally extending walls having an opening on one end of said first and second walls creating a groove therebetween for engaging said wire wrap connection of said tail ends of said adjacent terminals, said first and second walls are made of an electrically conducting material; and (b) at least one corresponding cut-out on each of said first and second walls indented and extending into said groove for independently engaging said tail end of at least one of said terminal.

2. The bridging clip according to claim 1 wherein each of said tail end and said wire wrap connection of said terminal further having predetermined diameters, wherein said first and second walls are curved such that the narrowest distance between said first and second wall is at a predetermined distance slightly less than the diameter of said wire wrap connection and said corresponding set of cut-outs are also curved such that the narrowest distance between said corresponding set of cut-outs is at a predetermined distance slightly less than the diameter of said tail end, such that upon engagement of said terminals, said first and second walls and said corresponding set of cut-outs flex axially away from said wire wrap connection and said tail end, respectively.

3. The bridging clip according to claim 2 wherein said electrically conducting material of said first and second walls having resiliency, such that said first and second walls and said corresponding set of cut-outs exert axial force against said wire wrap connection and said tail end, respectively, upon engagement of said terminals.

4. The bridging clip according to claim 1 wherein said integrated first and second walls having a generally elongated omega-shape cross-section and said corresponding set of cut-outs having a partially overlapped but non-elongated omega-shape cross section.

5. The bridging clip according to claim 1 wherein each of said cut-out is U-shaped.

6. The bridging clip according to claim 1, wherein said first wall further having at least one notch positioned between adjacent cut-outs on said first wall, said notch allows independent engagement of each of said wire wrap connections of adjacent terminals.

7. The bridging clip according to claim 6, wherein said second wall further having at least one notch positioned between adjacent cut-outs on said first wall, said notch allows independent engagement of each of said wire wrap connections of adjacent terminals.

* * * * *